(12) United States Patent
Hirler et al.

(10) Patent No.: US 7,952,166 B2
(45) Date of Patent: May 31, 2011

(54) SEMICONDUCTOR DEVICE WITH SWITCH ELECTRODE AND GATE ELECTRODE AND METHOD FOR SWITCHING A SEMICONDUCTOR DEVICE

(75) Inventors: Franz Hirler, Isen (DE); Thomas Raker, Ottobrunn (DE)

(73) Assignee: Infineon Technologies Austria AG, Villach (AT)

( * ) Notice: Subject to any disclaimer, the term of this patent is extended or adjusted under 35 U.S.C. 154(b) by 410 days.

(21) Appl. No.: 12/125,496

(22) Filed: May 22, 2008

(65) Prior Publication Data
US 2009/0289690 A1 Nov. 26, 2009

(51) Int. Cl.
*H01L 29/739* (2006.01)
(52) U.S. Cl. . 257/591; 257/139; 257/592; 257/E29.027; 257/E29.028
(58) Field of Classification Search .................. 257/139, 257/591, 592, E29.027–E29.028
See application file for complete search history.

(56) References Cited

U.S. PATENT DOCUMENTS

| | | | |
|---|---|---|---|
| 2006/0145230 A1* | 7/2006 | Omura et al. | 257/302 |
| 2009/0008709 A1* | 1/2009 | Yedinak et al. | 257/331 |

FOREIGN PATENT DOCUMENTS

| | | |
|---|---|---|
| DE | 112004002608 T5 | 11/2006 |
| DE | 102005038441 A1 | 2/2007 |
| DE | 102005041358 A1 | 3/2007 |

OTHER PUBLICATIONS

Hilleringmann, U.: "Silicon Semiconductor Technology", 4th revised and extended edition, May 2004.
"Theoretical Investigation of Silicon Limit Characteristics of IGBT", Akio Nakagawa, 18th Internation Symposium of Power Semiconductor Devices & IC's, Jun. 4-8, 2006 Naples, Italy.

* cited by examiner

*Primary Examiner* — Zandra Smith
*Assistant Examiner* — Minchul Yang
(74) *Attorney, Agent, or Firm* — Dicke, Billig & Czaja, PLLC (57) ABSTRACT

A semiconductor device with switch electrode and gate electrode and a method for switching a semiconductor device. One embodiment provides a semiconductor substrate with an emitter region, a drift region, a body region and a source region. The drift region is formed between the emitter and the body region while the body region is formed between the drift and the source region. A first trench structure extends from the source region at least partially into the drift region. The first trench structure includes a gate electrode arranged next to the body region and a switch electrode arranged in portions next to the drift region, wherein the switch and gate electrodes are electrically insulated from each other in the trench structure. A first gate driver is electrically connected to the gate electrode while a second gate driver is electrically connected to the switch gate.

25 Claims, 8 Drawing Sheets

SEMICONDUCTOR DEVICE WITH SWITCH ELECTRODE AND GATE ELECTRODE AND METHOD FOR SWITCHING A SEMICONDUCTOR DEVICE

BACKGROUND

This description refers to embodiments of a semiconductor device having a gate and switch electrode and a method for switching a semiconductor device. In one embodiment, the present description pertains to power semiconductor devices such as IGBTs (Insulated Gate Bipolar Transistors) having a switch electrode and a gate electrode arranged in a trench structure, and to a method for switching such power semiconductor devices.

It is an ongoing desire in the development of power semiconductor devices to reduce the switching losses while maintaining the saturation voltage. In case of an IGBT, the saturation voltage is denoted by $V_{CE,sat}$, wherein CE indicates the voltage between collector and emitter terminal.

Some attempts to reduce the switching losses of bipolar devices such as IGBTs include the integration of a p-channel field effect transistor parallel to the n-channel field effect transistor used for controlling the IGBT. In an on-state of the IGBT, the p-channel field effect transistor is blocked, i.e. it does not provide an electrical path between the drift region and the emitter terminal of the IGBT. Shortly before the n-channel field effect transistor is switched off to block the IGBT, the p-channel field effect transistor is switched on to provide a bypass through which the holes, which form the minority charge carriers, can flow to the emitter terminal. This reduces the charge stored in the drift region at low $V_{CE}$ and reduces switching losses.

Another approach includes formation of a plurality of trenches between which mesa structures having a small lateral width are arranged. The narrow width of the mesa structures causes a significant increase of minority charge carriers which reduces the saturation voltage $V_{CE,sat}$.

For unipolar devices, for example power field effect transistors such as trench MOS-FETs, other approaches are used. For example, two electrodes can be formed in the trench, the upper one of which forms the gate electrode while the lower one is used as field electrode. Typically, the field electrode is clamped at source potential to reduce the gate-drain capacitance. In one embodiment, a voltage for generating an accumulation channel can be supplied to the field electrode. Moreover applying a suitable voltage for reducing the electric field over the oxide layer insulating the field and gate electrodes from the semiconductor substrate has also been suggested to allow reduction of the thickness of the oxide layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The term "lateral" as used in this specification intends to describe an orientation parallel to the main surface of a semiconductor substrate.

The term "vertical" as used in this specification intends to describe an orientation which is arranged perpendicular to the main surface of the semiconductor substrate.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

Specific embodiments described in this specification pertain to, without being limited thereto, power semiconductor devices and in one embodiment to bipolar devices which are controlled by field-effect such as IGBTs.

In this description, n-doped is referred to as first conductivity type while p-doped is referred to as second conductivity type. It goes without saying that the semiconductor devices can be formed with opposite doping relations so that the first conductivity type can be p-doped and the second conductivity type can be n-doped. Furthermore, the Figures illustrate relative doping concentrations by indicating "−" or "+" next to the doping type. For example, "n−" means a doping concentration which is less than the doping concentration of an "n"- doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an n+ and a p+ region.

According to one embodiment, a semiconductor device is provided. The semiconductor device includes a semiconductor substrate with an emitter region of a second conductivity type, a drift region of a first conductivity type, a body region of the second conductivity type and a source region of the first conductivity type. The drift region is formed between the emitter and the body region while the body region is formed between the drift and the source region. The semiconductor device further includes at least a first trench structure extending from the source region at least partially into the drift region. The first trench structure includes at least a gate electrode arranged next to the body region and at least a switch electrode arranged at least in portions next to the drift region, wherein the switch and gate electrodes are electrically insulated from each other in the trench structure. Furthermore, a first gate driver is electrically connected to the gate electrode while a second gate driver is electrically connected to the switch electrode.

According to another embodiment, a method for switching a semiconductor device is provided. The method includes providing a semiconductor device with an emitter region of a second conductivity type, a drift region of a first conductivity type, a body region of the second conductivity type and a source region of the first conductivity type. The drift region is formed between the emitter and the body region while the body region is formed between the drift and the source region. The semiconductor device further includes at least a first trench structure extending from the source region at least partially into the drift region. The first trench structure includes at least a gate electrode arranged next to the body region and at least a switch electrode arranged at least in portions next to the drift region, wherein the switch and gate electrodes are electrically insulated from each other in the trench structure. The method further includes bringing the semiconductor device into an on-state by applying a first on-voltage of a second polarity to the gate electrode to generate a conductive channel in the body region and by applying a second on-voltage of the second polarity to the switch electrode. Furthermore, bringing the semiconductor device into an off-state includes applying a first off-voltage to the switch electrode before applying a second off-voltage to the gate electrode, wherein the first and second off-voltages are selected from zero voltage or voltages of first polarity.

The switch electrode arranged next to the drift region can be used for generating a potential barrier for the minority charge carriers to reduce their flow to the body region. The minority charge carriers are therefore accumulated in the drift region and this reduces the saturation voltage. To reduce switching losses, the voltage applied to the switch electrode is changed shortly before switching-off of the semiconductor device so that the potential barrier becomes small and the minority charge carriers can flow to the body region. Since the storage charge in the drift region is extracted at low $V_{CE}$, the switching losses are reduced.

Figure 1:
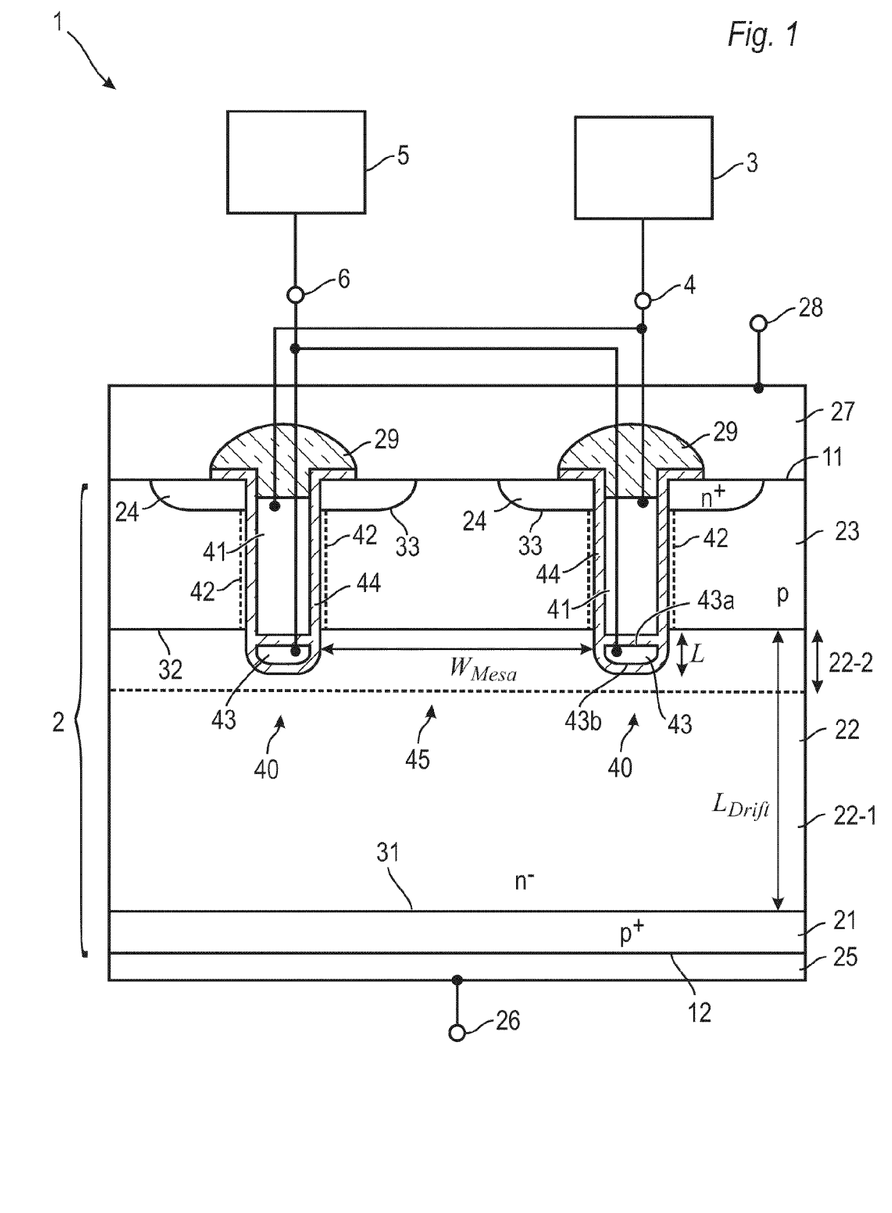
FIG. 1 illustrates a semiconductor device according to one embodiment having a first and a second gate driver.

With reference to FIG. 1, one embodiment of a semiconductor device is described. The semiconductor device 1 includes a semiconductor substrate 2 having a first surface 11 and a second surface 12 arranged opposite to the first surface 11. The semiconductor substrate 2 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC materials are used.

The semiconductor substrate 2 can be a single bulk mono-crystalline material. It is also possible, that the semiconductor substrate 2 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

The semiconductor substrate 2 further includes an emitter region 21 of the second conductivity type. In this embodiment, emitter region 21 is highly p-doped. In contact with emitter region 21, a drift region 22 of the first conductivity type is formed. Drift region 22 is a weakly n-doped region and forms a first pn-junction 31 with p-doped emitter region 21. In one or more embodiments, a field stop or drain region of the first conductivity type having a higher doping concentration than the drift region 22 can be formed between the drift region 22 and the emitter region 21. In one or more embodiments, the drift region 22 can have a doping concentration in a range from about $10^{13}/cm^3$ to about $10^{15}/cm^3$. In further embodiments, the emitter region 21 can have a doping concentration in a range from about $10^{13}/cm^3$ to about $10^{16}/cm^3$.

A p-doped body region 23 is formed on and in contact with the drift region 22. Thereby a second pn-junction 32 is formed. In one or more embodiments, the body region 23 can have a typical doping concentration in a range from about $10^{15}/cm^3$ to about $10^{18}/cm^3$. As illustrated in FIG. 1, at least one highly n-doped source region 24 is embedded in the body region 23. In one or more embodiments, source region or regions 24 can have a doping concentration in a range from about $10^{17}/cm^3$ to about $10^{20}/cm^3$. Third pn-junctions 33 are formed between the source regions 24 and the body region 23.

Typically, the semiconductor substrate 2 is formed by providing a single bulk mono-crystalline body on which one or more single-crystalline layers are depositing epitaxially. The epitaxial layer or layers accommodates or accommodate the drift region 22, body region 23 and source region or regions 24. During epitaxial deposition, the desired doping concentration of the drift region 22 is adjusted by supplying an appropriate amount of dopant. Different thereto, the body region 23 and the source region or regions 24 are typically formed in the epitaxially deposited layer by implantation. It would also be possible to form the body region 23 during epitaxial deposition by appropriately providing dopants of the second conductivity type in the desired concentration. The source region 24 can also be formed as a substantially continuous layer by implantation or during epitaxial deposition. If desired, the manufacturing can include separate epitaxial deposition steps with different dopants of varying concentration or with the same dopant but with varying concentration to form the respective functional regions. In one or more embodiments, the final doping concentration of the drift region 22 can vary to include doping profiles having at least one minimum or at least one maximum or having a increasing or decreasing doping concentration from the emitter region 21 to the body region 23.

In other embodiments, a substrate wafer having the desired background doping concentration of the drift region 22 is provided. The substrate wafer is suitably thinned and body region 23 and source region 24 are formed by implantation at the first surface 11. If desired, the substrate wafer can be further thinned at the second surface 12 and emitter region 21 is formed by implantation at the second surface 12. It would also possible to thin the substrate wafer after implanting source and body regions only. By using this approach, an expensive epitaxial deposition is avoided.

At least one trench structure 40 is formed in the semiconductor substrate 2. The embodiment illustrated in FIG. 1 includes at least two trench structures 40 formed adjacent and in spaced relation to each other. Each trench structure 40 extends from the first surface 11 through the source and body regions 23 and 24 at least partially into the drift region 22. As it becomes more apparent from the description below, the trench structures 40 extend to an upper portion of the drift region 22 only and do not substantially completely penetrate the drift region 22 because a complete depletion of the drift region 22 by a subsequently described switch electrode is not intended. In other embodiments, the trenches 40 can extend up to a lower portion of the drift region 22 for semiconductor devices having a very thin drift region.

Each trench structure 40 includes at least a gate electrode 41 formed in the upper portion of the trench structures 40 next to the body region 23. The gate electrodes 41 cause the formation of respective conductive channels 42 during operation of the semiconductor device 1. As explained in more detail below, when a voltage larger than a threshold voltage is applied to the gate electrode 41, a conductive channel 42 of the second conductivity type, in the present embodiment of n-type, is formed along the sidewalls of the trench structure 40 to connect electrically source region 24 with drift region 22.

Furthermore, each trench structure 40 includes a switch electrode 43 arranged at least partially below the gate electrode 41. In some embodiments, switch electrodes 43 are arranged in a lower portion of the trench structures 40 as illustrated in FIG. 1. The switch electrodes 43 can be arranged next to the drift region 22 and particularly in an upper portion of the drift region 22 in proximity to the second pn-junction 32. As described in more detail below, in one or more embodiments, the switch electrode or electrodes 43 are arranged to allow generation of an effective potential barrier for minority charge carriers within the drift region 22 and close to the second pn-junction 32. To this end, the effective upper end of the switch electrode 43 is arranged below the second pn-junction 32. In one embodiment, switch and gate electrodes 43 and 41, respectively, are arranged above each other and the upper end 43a of the switch electrode 43, which also forms the effective upper end, is arranged below the second pn-junction 32.

The switch electrode 43 extends into the drift region 22 such that its lower end 43b is arranged at a depth or length L when measured from the second pn-junction 32. The drift region 22 has a vertical extension $L_{Drift}$. In certain embodiments, L is not more than $0.2*L_{Drift}$. In other embodiments, L is not more than $0.1*L_{Drift}$. This means that the switch electrode 43 is arranged in the upper 20% or the upper 10% of the drift region 22. By arranging the switch electrode 43 in the upper portion of the drift region 22 next to the second pn-junction 32 an effective potential barrier for the minority charge carriers can be formed in proximity to the second pn-junction 32.

The switch electrode 43 differs from not illustrated field electrodes which can be arranged in the trench structures 40. The purpose of the field electrodes is to deplete the drift region 22 in a blocking state which allows to raise the doping concentration of the drift region into a range from about $10^{16}/cm^3$ to about $5*10^{17}/cm^3$. Therefore, field electrodes significantly extend into the drift region 22 and their lower ends are typically arranged at a depth of more than $0.5*L_{Drift}$ and typically at a depth from $0.7*L_{Drift}$ to about $1.2*L_{Drift}$, when measured from the second pn-junction 32, i.e. the field electrodes can also completely penetrate the drift region 22 and extend into the emitter region 21.

The gate electrode 41 and the switch electrode 43 are insulated from each other in the trench structures 40 by an insulating layer 44, which also insulates the gate and switch electrodes 41, 43 from the semiconductor substrate 2. The insulating layer 44 can have a constant thickness or a varying thickness. For example, the thickness of the insulating layer 44 between the gate electrode 41 and the semiconductor substrate 2 can be thinner than between the switch electrode 43 and the semiconductor substrate 2. Furthermore, the insulating layer 44 can be made thicker between the gate and switch electrodes 41, 43 than between the electrodes and the semiconductor substrate 2. In other embodiments, different insulating materials can be used for the insulating layer 44. For example, a portion of the insulating layer 44 can include a first material and another portion can include a second material, wherein the portions are arranged, for example, between the gate electrode 41 and the body region 23 and between the switch electrode 43 and the drift region 22, respectively. In another embodiment, the insulating layer 44 can be formed by a layer stack of different materials such as oxides and nitrides.

Between adjacent trench structures 40, a mesa structure 45 is formed which extends up to the first surface 11 of the semiconductor substrate 2. Typically, the body region 23 and the source region or regions 24 are completely formed within the mesa structure 45. Furthermore, the upper portion of the drift region 22 is also arranged at least partially in the mesa structure 45.

The mesa structure 45 has a lateral extension or width $W_{Mesa}$ which can be in certain embodiments about 1 µm or less. In other embodiments, $W_{Mesa}$ is about 0.5 µm or less. In further embodiments, $W_{Mesa}$ is about 0.2 µm or less. Typically, a narrow mesa structure 45 is formed in many embodiments to enhance the potential barrier effect generated by the switch electrodes 43.

The mesa structure 45 with its adjacent trench structures 40 form a device cell of the semiconductor device 1. For power semiconductor devices such as IGBTs, the device includes a plurality of substantially identical device cells. Therefore, FIG. 1 only illustrates a portion of a semiconductor device which includes a plurality of trench structures 40 forming respective mesa structures 45 between respective two adjacent trench structures 40.

The main function of the switch electrode 43 is to control the charge carrier distribution particularly in the upper portion of the drift region 22. Consider that an IGBT such as illustrated in FIG. 1 is provided. When applying a positive voltage to the gate electrode 41, electrons are accumulated at the sidewalls of the trench structures 40 to form a conductive inversion channel 42 which connects source region 24 with drift region 22. An electrical current can flow from source to emitter region. At the same time, holes forming minority charge carriers are injected from emitter 21 into the drift region 22. This contributes to a significant reduction of the on-state resistance because the electron and hole concentration in the drift region 22 are much higher than the doping concentration of the drift region 22 due to the high bipolar injection level. The holes can, on the other hand, flow through the body region 23 to the front metallisation 27 which would reduce the conductivity of the drift region 22. To reduce the discharge of minority charge carriers, i.e. the holes, a positive voltage is also applied to the switch electrodes 43. The positive voltage supplied to the switch electrodes 43 produces a potential barrier for the holes at least in proximity to the switch electrodes 43. To overcome this potential barrier and to maintain the holes current for a given total current, a higher gradient of the hole concentration is therefore required. The high gradient is provided by an increased hole concentration below and close to the switch electrodes 43 which results in a reduction of the saturation voltage $V_{CE,sat}$. If, on the other hand, a negative voltage or a voltage which is negative in comparison to the voltage applied to the gate electrode 41 is applied to the switch electrode 43, the potential barrier would be reduced. This would cause a significant hole current to the front metallisation 27 and would increase the saturation voltage $V_{CE,sat}$.

Since the switch electrodes 43 control and influence the distribution of the charge carriers, the switch electrode 43 can also be referred to as "plasma gate" wherein the term plasma refers to the charge plasma in the drift region 22.

In one or more embodiments, a positive voltage, and in one or more embodiments a voltage which is positive with respect to the voltage applied to the gate electrodes 41, is applied to the switch electrodes 43 to build up the potential barrier for reducing $V_{CE,sat}$. Shortly before switching off the semiconductor device 1, the switch electrodes 43 are either brought to source potential or to a negative potential. By doing so, the holes are allowed to flow to body region 23, and the concentration of the holes in the drift region 22 reduces. This leads to a reduction of the charge stored in the drift region 22 and increases $V_{CE,sat}$ so that the switching losses are reduced when turning off the semiconductor device 1.

This effect is enhanced when the width $W_{Mesa}$ of the mesa structure 45 is comparable small. Suitable widths $W_{Mesa}$ are 1 μm and less. More generally, the mesa structure 45 should be substantially completely depletable. This is the case for a typical doping concentration of the drift region 22, particularly for a small $W_{Mesa}$. In other words, the following depletion relation should be fulfilled:

$$\int_0^W N(x)\,dx \leq 6*Q_C,$$

wherein $Q_C$ is the breakdown charge of the drift region at the doping concentration $N(x)$ in the drift region 22. W denotes here the mesa width $W_{Mesa}$ between the first and second trench structures 40. If the drift region 22 has a constant doping concentration at least in the region of the mesa structure 45, the above relation simplifies to $$N*W \leq 6*Q_C.$$

In case of silicon, $Q_C$ is about $2.67*10^{10}*N^{1/8}$ cm$^{-2}$. In certain embodiments, the above depletion relation should be fulfilled to ensure complete depletion of the mesa structure:

$$N*W \leq 2*Q_C.$$

In certain embodiments, the doping concentration of the drift region 22 can be reduced in a region between the switch electrodes 43 to enhance the effect caused by the switch electrodes 43. In another embodiment or in addition to that, a compensation doping can be added into the drift region 22 close to and between the switch electrodes 43. The drift region 22 can therefore have a first portion 22-1 and a second portion 22-2, wherein the second portion 22-2 is arranged between the first portion 22-1 and the body region 23. The second portion 22-2 can have a lower doping concentration than the first portion 22-1. The vertical extension of the second portion 22-2 is indicated in FIG. 1 and can be about 1 μm to about 10 μm. In another embodiment, first and second portions 22-1 and 22-2 can have the same doping concentration of the first conductivity type while second portion 22-2 includes an additional compensation doping of the second conductivity type which results in a reduced net doping concentration in comparison to the first portion 22-1.

In other embodiments, a reduced doping concentration of the source regions 24 is used to reduce the short circuit current. To this end, it is possible to reduce the implantation dose when forming the source regions 24. An option is the use of a mask having openings with reduced cross-sectional area. For example, additional strips of mask material can be left within the opening defining the source regions 24 to reduce the total amount of implanted dopants.

The semiconductor device 1 also includes a front metallization 27 formed on the first or front (upper) surface 11 of the semiconductor substrate 2 to provide an electrical connection to body and source regions 23, 24. The front metallization 27 includes a terminal 28 which is also referred to as emitter terminal due to the bipolar nature of the IGBT. Accordingly, a back metallization 25 is arranged on the second or back (lower) surface 12 of the semiconductor substrate 2 to provide an electrical connection to emitter region 21. The back metallization 21 includes a terminal 26 which is referred to as collector terminal. An insulation plug 29 is provided on each trench structure 40 to insulate the gate and switch electrodes 41, 43 from the front metallization 27.

Figure 4:
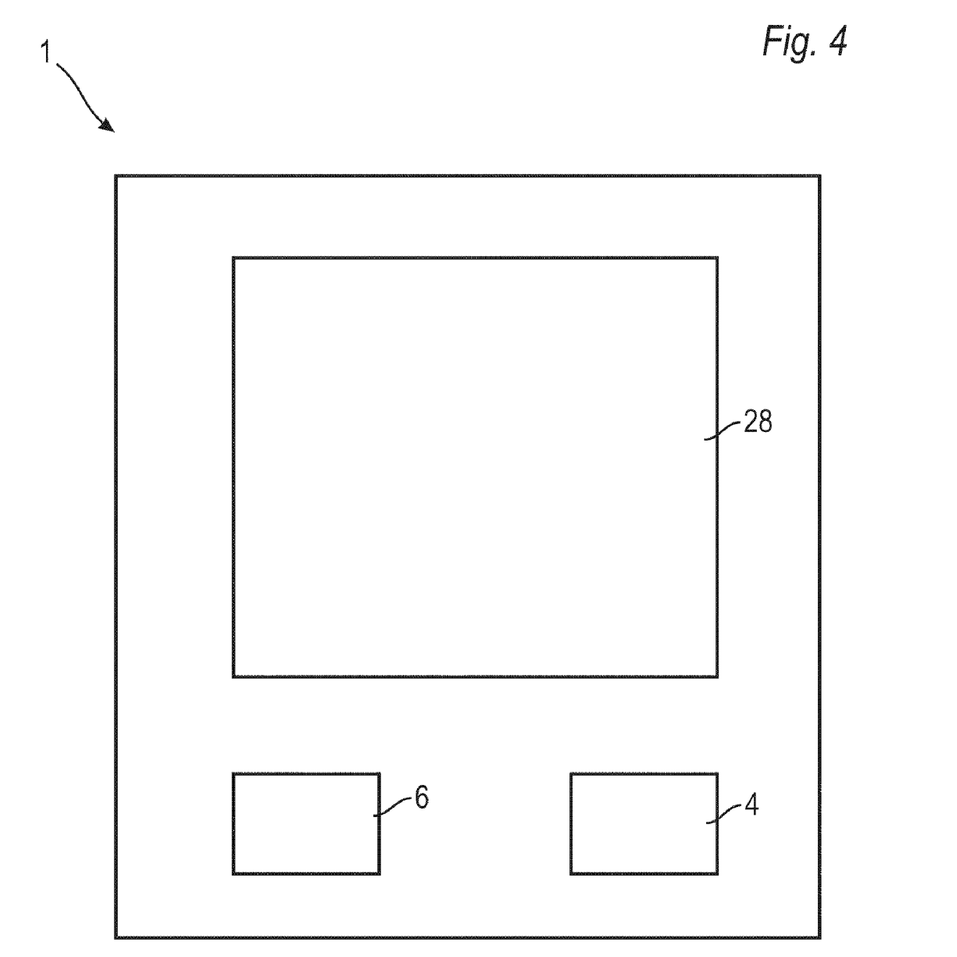
FIG. 4 illustrates a semiconductor device according to yet another embodiment having separate gate pads connected to the switch and gate electrodes, respectively.

In this embodiment, the gate electrodes 41 are electrically connected to a first gate driver 3 while the switch electrodes 43 are electrically connected to a separate second gate driver 5. The first and second gate drivers can be provided externally to the semiconductor device 1. In this case, separate terminals 4 and 6 are provided on the semiconductor device 1. A skilled person will appreciate that the terminals 4, 6 and 28 can be formed by pad structures which are formed by a not illustrated metallization layer arranged on the semiconductor substrate 2. Furthermore, the semiconductor substrate 2 is typically encapsulated with a suitable insulating material which leaves the terminals or pad structures exposed. FIG. 4 illustrates a plan view on a semiconductor device 1 with a large emitter terminal or pad structure 28 and two separate pad structures 4 and 6 which form the gate electrode terminal and the switch electrode terminal, respectively. On the not illustrated lower side of the semiconductor device 1, a large collector pad structure is formed. In one or more embodiments, semiconductor device 1 with external gate driver or drivers forms a power semiconductor unit. A power semiconductor unit can, however, also be formed by a semiconductor device 1 having one or more integrated gate drivers.

The first and second gate drivers 3 and 5 can either be directly electrically connected to the gate and switch electrodes 41 and 43, respectively, or selectively via additional passive elements such as capacitors and resistors. This provides more options in designing the signal behaviour and the switching characteristics of the semiconductor device 1.

In other embodiments, the first and second gate drivers 3 and 4 are integrated into the semiconductor substrate 2 or formed as separated devices but integrated in the packaging of the semiconductor device 1, i.e. the separate gate drivers 3 and 4 are encapsulated together with the semiconductor substrate 2. In further embodiments, only the first gate driver 3 or only the second gate driver 4 is integrated while the respective other is provided separately. When integrating the respective gate drivers 3 and 4, respectively, control terminals may by provided which allows an external control of the gate drivers 3, 4.

Figure 2:
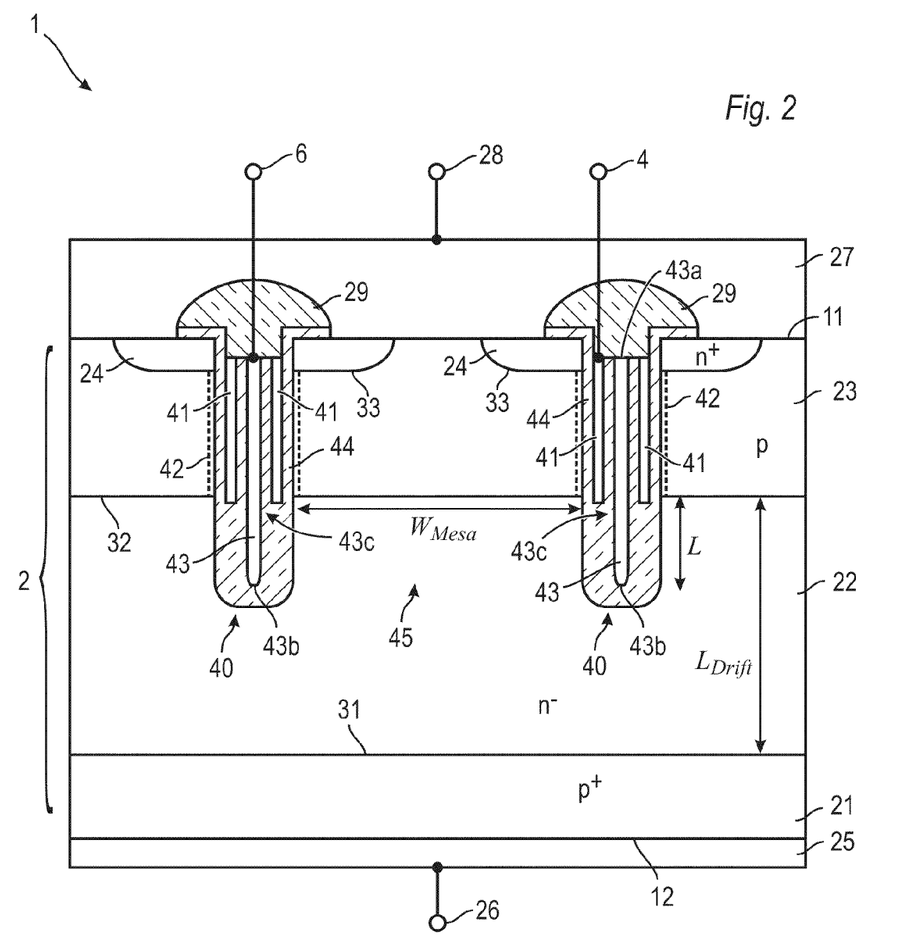
FIG. 2 illustrates a semiconductor device according to one embodiment having a switch electrode partially arranged between portions of the gate electrodes.

A further embodiment is illustrated in FIG. 2. This embodiment has substantially the same arrangement as the embodiment illustrated in FIG. 1 except for the shape and arrangement of the gate and switch electrodes 41, 43. FIG. 2 illustrates the semiconductor substrate 2 in a cross-sectional view perpendicular to the first and second surfaces 11 and 12, respectively. In this view, two gate electrodes 41 are arranged in each trench structure 40 with the switch electrode 43 arranged at least partially between the two gate electrodes 41. The two gate electrodes 41 of each trench structure 40 can be formed by separate structures or can be portions of a common gate structure which appear to include two separate parts when viewing in this cross-sectional view. In some embodiments, the gate electrodes 41 can be formed by two plates running parallel and spaced to each other.

Irrespective of the actual design of the gate electrodes 41, the switch electrode 43 is arranged partially between the gate electrodes 41 and protrudes from the lower end of the gate electrodes 41. The switch electrode 43 is therefore partially shielded by the gate electrodes 41 with respect to its capability to form a potential barrier. Therefore, the switch electrode 43 has an effective upper end 43c defined by the lower end of the gate electrodes 41. The effective upper end 43c is arranged below the second pn-junction 32. As in the embodiment illustrated in FIG. 1, the switch electrode 43 is electrically insulated from the gate electrode 41 by insulating layer 44.

FIG. 2 does not illustrate gate drivers. A skilled person will appreciate that separate gate drivers are connected to the respective terminals, wherein the gate drivers can be integrated or provided externally. It would also be possible, as described in connection with FIG. 3, to use a common gate driver and a retardation element.

Figure 3:
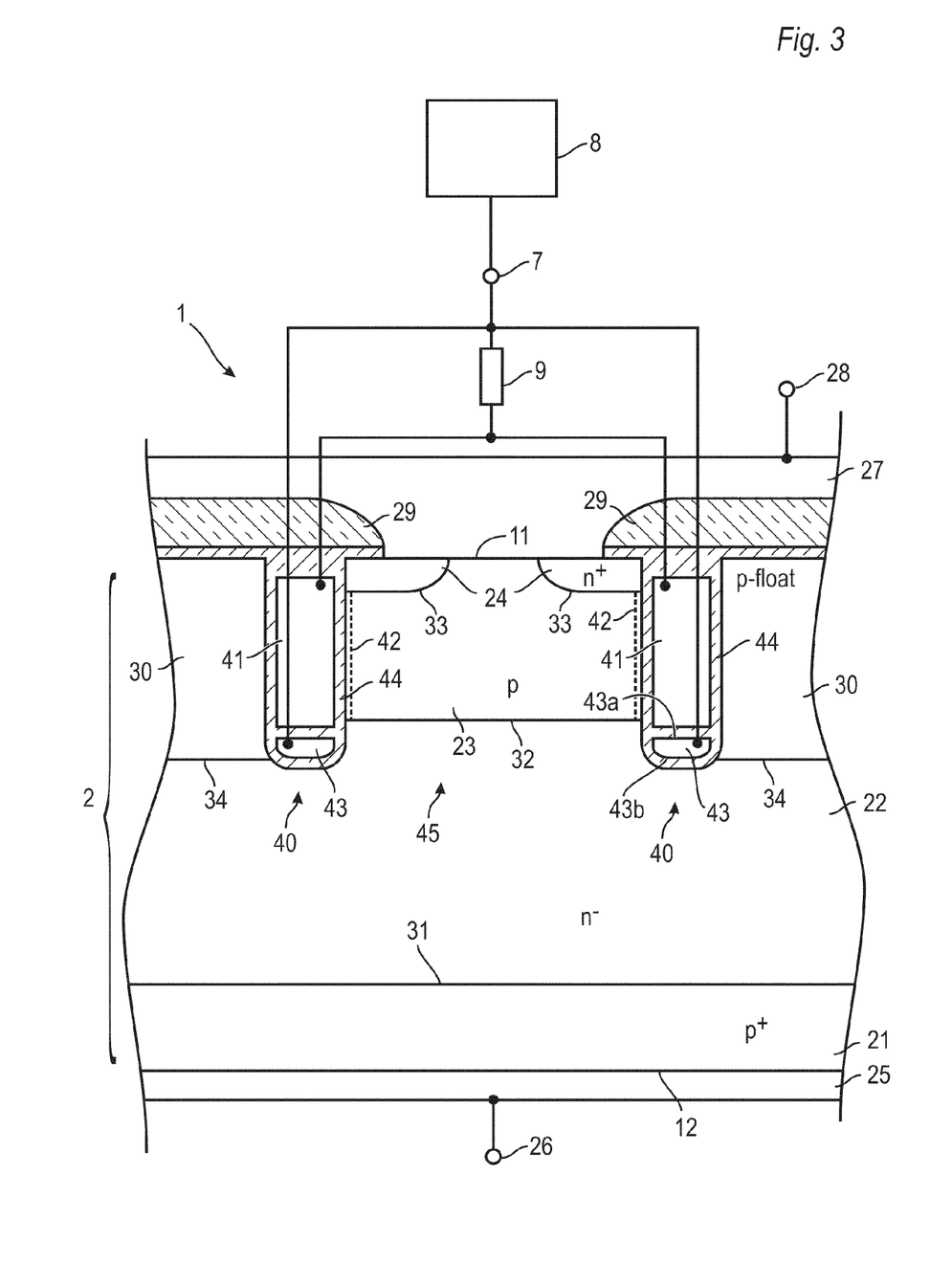
FIG. 3 illustrates a semiconductor device according to another embodiment having a common gate driver and a retardation element.

A further embodiment is illustrated in FIG. 3. This embodiment includes at least one additional floating region 30 of the second conductivity, i.e. the floating region 30 is not clamped at a specific voltage. In this specific embodiment, the floating region 30 has a larger vertical extension than the body region 23, i.e. the lower edge of the floating region 30 is below the lower edge of the body region 23. In other embodiments, the lower edge of the floating region 30 can even be lower than the lower end of the trench structures 40. In further embodiments, the lower edge of the floating region 30 can be at the same level as the lower edge of the body region 23, i.e. at the same level as the second pn-junction 32. Between the floating region 30 and the drift region 22 a fourth pn-junction 34 is formed.

The embodiment illustrated in FIG. 3 also includes a further modification relating to the gate drivers. Here, a common gate driver 8 is used instead of the separate first and second gate drivers 3 and 5. The common gate driver 8 is electrically connected to a common gate terminal 7 of the gate and switch electrodes 41, 43. The common gate terminal 7 is in this embodiment directly connected to the switch electrodes 43 so that a direct electrical connection between the common gate driver 8 and the switch electrodes 43 is provided. In other embodiments, additional passive components can be provided through which the common gate driver 8 is electrically connected to the switch electrodes 43.

Between the common gate driver 8 and the gate electrodes 41 there is provided at least one retardation element 9. The main purpose of the retardation element 9 is to ensure that the off-voltage supplied by the common gate driver 8 is first fully supplied to the switch electrodes 43 before it is fully supplied to the gate electrodes 41. Typically, the retardation element 9 results in a constant retardation of the signal applied. For many applications it is sufficient to provide a constant delay. By using the retardation element 9, only a common gate driver 9 is needed.

In certain embodiments, the retardation element 9 is formed by a RC-circuit (resistor-capacitor circuit). In further embodiments, an additional resistor is used only as retardation element which forms together with the capacitance of the gate electrodes 41 an RC-circuit. It goes without saying that the switch electrodes 43 also have a given capacitance. In many embodiments, the capacitance of gate and switch electrodes 41 and 43 differs from each other. When using an appropriate resistor as retardation element 9, the RC-circuit formed by the capacitance of the gate electrodes 41 and the resistor leads to a sufficient delay of the voltage signal supplied to the gate electrodes 41. Even in the case of identical capacitances of gate and switch electrodes 41 and 43, respectively, a resistor would be sufficient in many applications. In one embodiment, a resistor can also be provided between the common gate driver 8 and the switch electrodes 43 to adjust the course of the signal supplied. In further embodiments, both the gate electrode 41 and the switch electrode 43 can be connected to the common gate driver 8 with respective separate retardation elements to have more freedom in adjusting the switching behaviour of the semiconductor device 1.

In the embodiment illustrated in FIG. 3, the common gate driver 8 is provided externally to the semiconductor device 1. In this case, a common gate pad is formed to allow external connection. The retardation element 9 can be integrally formed as illustrated in FIG. 3 or externally provided. In the latter case, two separate electrode terminals, one for the gate electrodes 41 and the other for the switch electrodes 43, are provided. In other embodiments, the common gate driver 8 and the retardation element 9 are integrated in the semiconductor device 1 either directly into the semiconductor substrate 2 or as separate devices within the packaging of the semiconductor device 1 as described above.

A skilled person will appreciate that the embodiments illustrated in FIGS. 1 and 2 can also be modified to include a common gate driver 8 and a retardation element 9 without the need to have two separate gate drivers 3 and 5.

Figure 5:
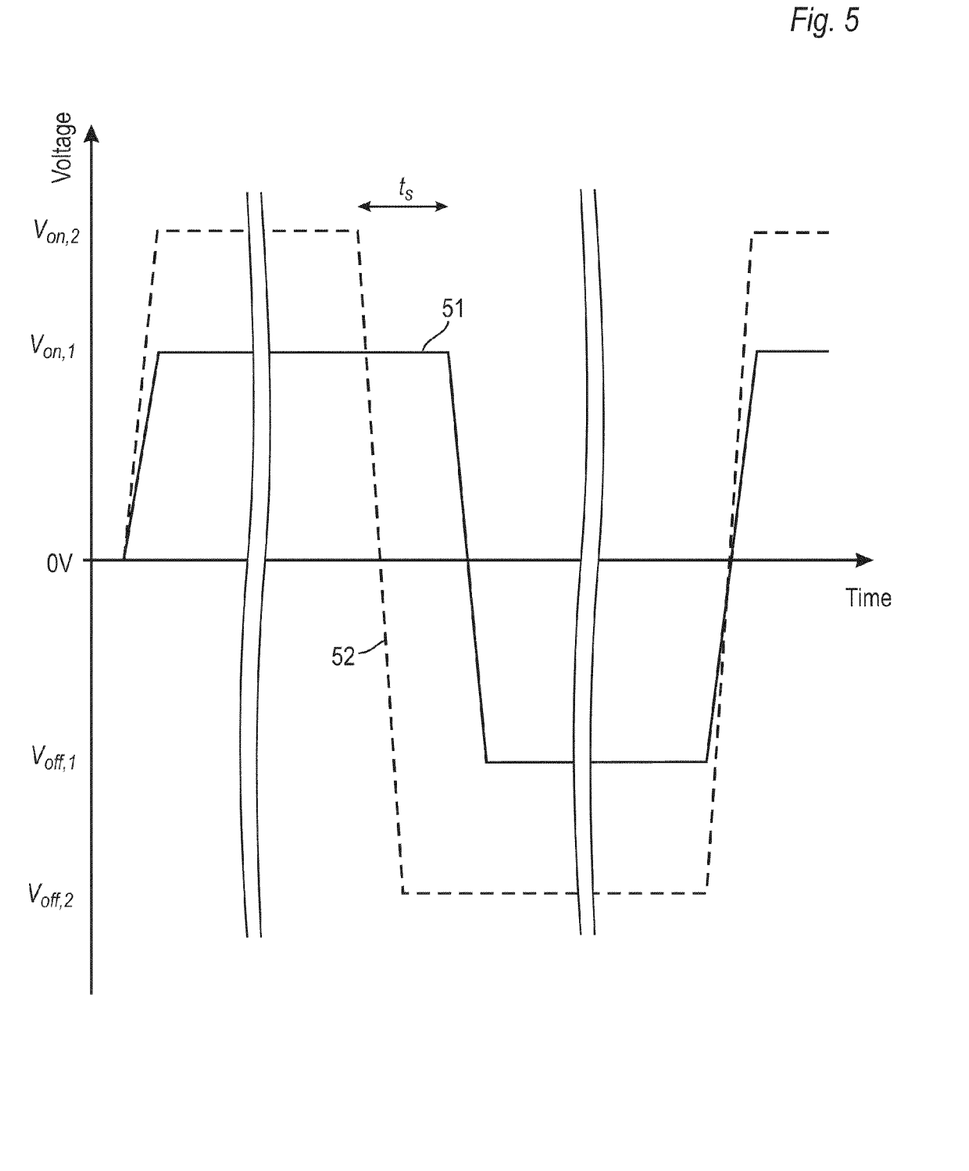
FIG. 5 illustrates the switching of a semiconductor device according to one embodiment.

One embodiment of a method for controlling the semiconductor device will be described next in conjunction with FIGS. 5 and 6. FIG. 5 illustrates an example of the input signals supplied to the gate and switch electrodes 41, 43 while FIG. 6 illustrates the results of a simulation for estimating the minority charge carrier distribution.

To bring the semiconductor device 1, for example the IGBT of FIG. 1, into an on-state, a first positive voltage ($V_{on,1}$) is applied to the gate electrode 41. In FIG. 1, the solid line 51 illustrates the gate signal. At a same time, a second positive voltage ($V_{on,2}$) is applied to the switch electrode 43. The course of the switch signal is denoted by dashed line 52. The positive voltage applied to the gate electrode 41 causes formation of a conductive channel 42 which makes the IGBT conductive. The positive voltage applied to the switch electrode 43 generates a potential barrier for the holes, i.e. the minority charge carriers. The minority charge carriers are therefore retained in the drift region 22 and accumulate close to the second pn-junction. The extent to which the minority charge carriers are accumulated depends inter alia on the voltage applied to the switch electrode 43 and the total current flowing through the IGBT. The accumulation leads to an increased concentration of minority charge carriers in the drift region until the concentration gradient established is sufficient to overcome the potential barrier and to maintain the total current of the IGBT. Hence, a significant increase of the total charge carrier concentration is produced due to the action of the potential barrier. This reduces the on-state losses and $V_{CE,sat}$.

Figure 6:
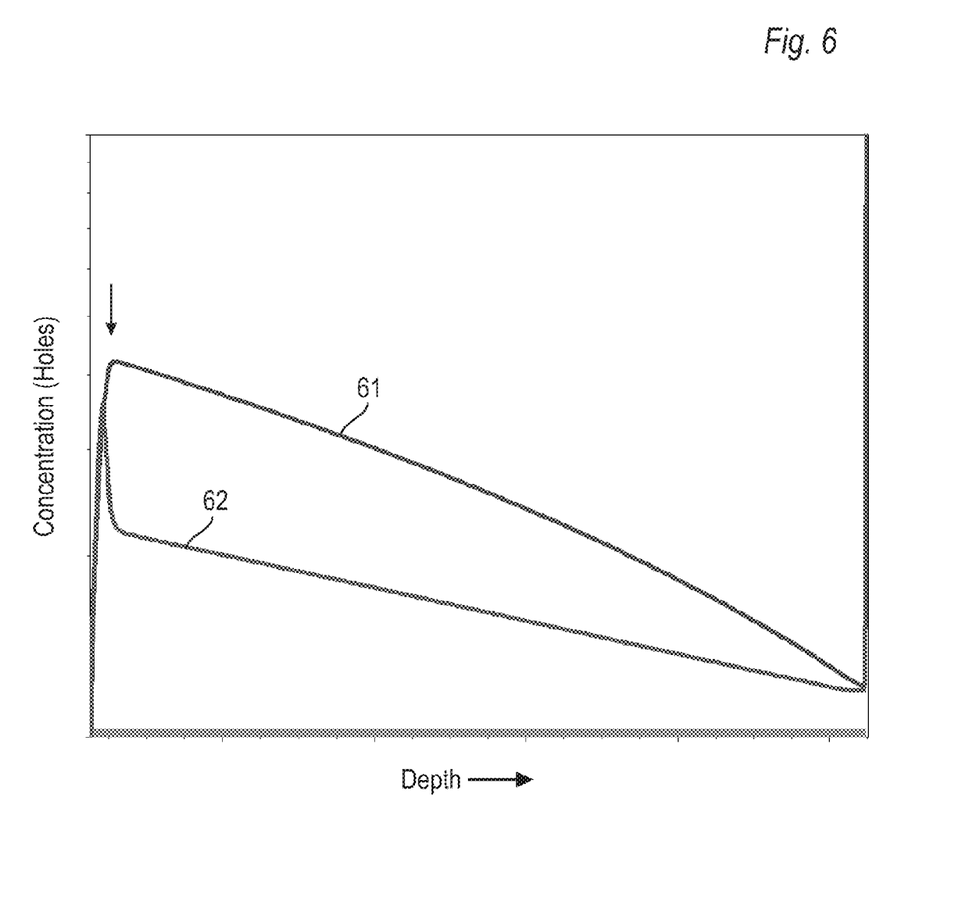
FIG. 6 illustrates the distribution of holes as a function of the electrical potential applied to the switch electrode.

FIG. 6 illustrates a simulated minority charge carrier distribution when both the gate electrodes 41 and the switch electrodes 43 are at the same positive voltage, which is in this simulation +15 V. Line 61 clearly illustrates a significant increase of the hole concentration with a peak concentration close to the bottoms of the trench structures 40, the location of which is indicated by the arrow. This simulation particularly illustrates a high voltage IGBT. Such high voltage devices feature blocking voltages for example between about 200 V and about 10000 V and can control currents for example in a range up to 45 A. To maintain such high blocking voltages, the vertical extension $L_{Drift}$ of the drift region 22 is appropriately selected and can be, for example, in a range from about 10 μm to about 1000 μm. To further improve the blocking and switching behaviour, narrow mesa structures 45 can be used, wherein the mesa width $W_{Mesa}$ can be less than 1 μm, for example 0.4 μm.

The simulated device has a comparably low $V_{CE,sat}$ when the potential barrier is formed. For example, $V_{CE,sat}$ can be in a range from about 1.0 V to about 6 V for the case that the gate and switch electrodes 41, 43 are at +15 V. An increase of the $V_{CE,sat}$ is observed when the switch electrode 43 is brought to −15 V as indicated by line 62 while maintaining the gate electrode 41 at +15 V. As it becomes apparent from a comparison of lines 61 and 62, switching of the switch electrode 43 to negative voltages reduces the potential barrier so that the holes can flow to the front metallisation 27. The hole concentration within the drift region 22 significantly falls and $V_{CE,sat}$ increases. For example, $V_{CE,sat}$ can rise into a region from about 1.3 V to about 1.5V.

The reduced hole concentration also means that the accumulated charge in the drift region is reduced so that the switching losses become smaller. To benefit from this, the switch electrode 43 is brought to a second negative voltages ($V_{off,2}$) shortly before a first negative voltage ($V_{off,1}$) is supplied to the gate electrodes 41 for switching off the device. The delay is denoted in FIG. 5 by $t_S$. In many embodiments, $t_S$ is in a range from about 0.2 μs to about 20 μs. In other embodiments $t_S$ can be in a range from about 0.4 μs to about 10 μs.

The embodiment of FIG. 5 includes different first and second on- and off-voltages for the switch and the gate electrodes. In other embodiments, the same on-voltage but different off-voltages can be supplied to the gate and switch electrodes. In further embodiments, different on-voltage but same off-voltages can be used while in other embodiments same on- and off-voltages can be used. The off-voltages are selected from zero voltage or negative voltages. In more general terms, the off-voltages are selected from zero voltage or voltages of first polarity, wherein a voltage of first polarity is one which does not cause formation of an inversion channel in the body region of the second conductivity type. The on-voltages are selected from positive voltages, or in more general terms, form voltages of second polarity. For example, it would be possible to supply a more positive voltage to the switch electrodes than to the gate electrodes during on-state to form a strong potential barrier while the same negative voltage is supplied to both the switch and gate electrodes during off-state.

Figure 7:
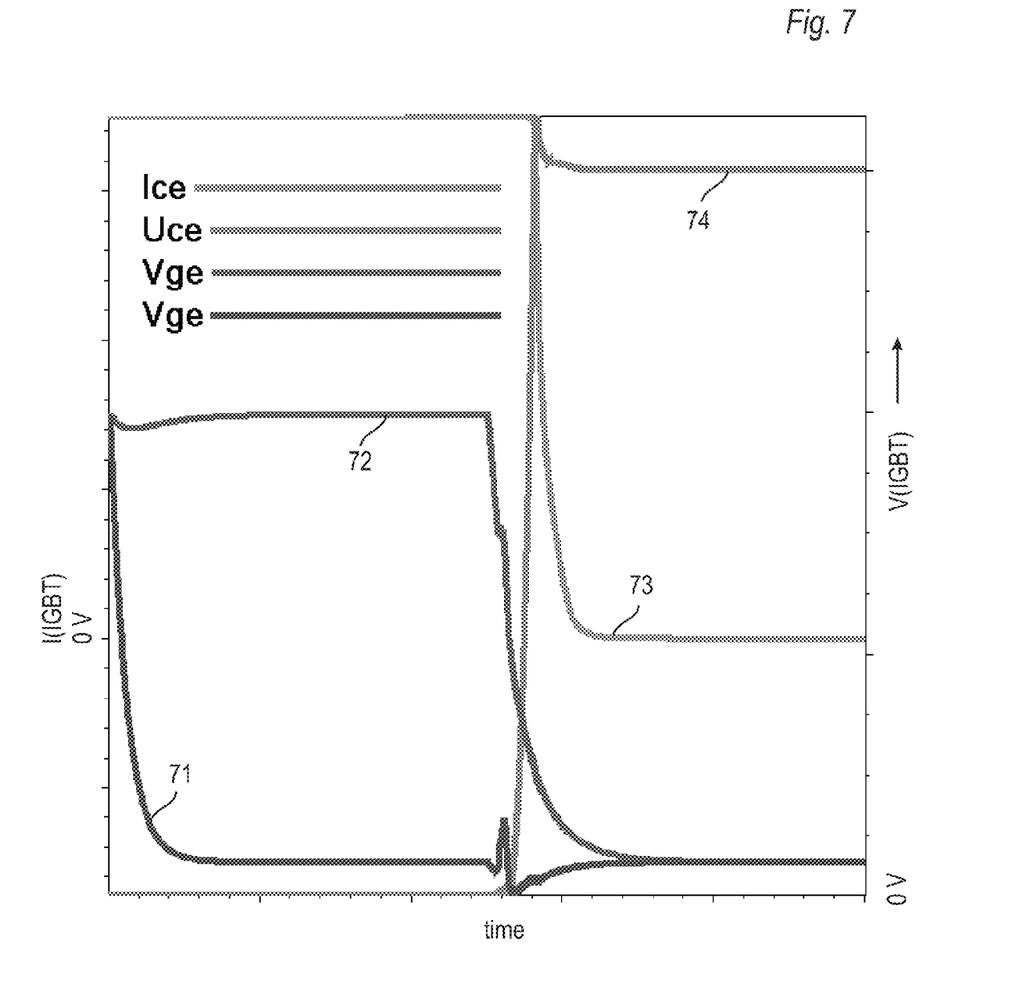
FIG. 7 illustrates the switching of a semiconductor device according to one embodiment.

Another simulation result is illustrated in FIG. 7 showing a "hard" commutation of an IGBT. First, the switch electrode 43 (line 71) is brought from a positive voltage to a negative voltage shortly before the gate electrode 41 (line 72) is brought from positive to negative voltage. The switching delay for the electrodes is in a range of few μs, for example 1 μs to 6 μs. As indicated by line 74, the voltage between emitter and collector terminal jumps to an intermediate voltage of 600V while the current (line 73) drops to zero when the gate electrode 41 is switched. In comparison with a reference structure having no switch electrode, a reduction of switching losses in a range of up to 20% can be reached.

Figure 8:
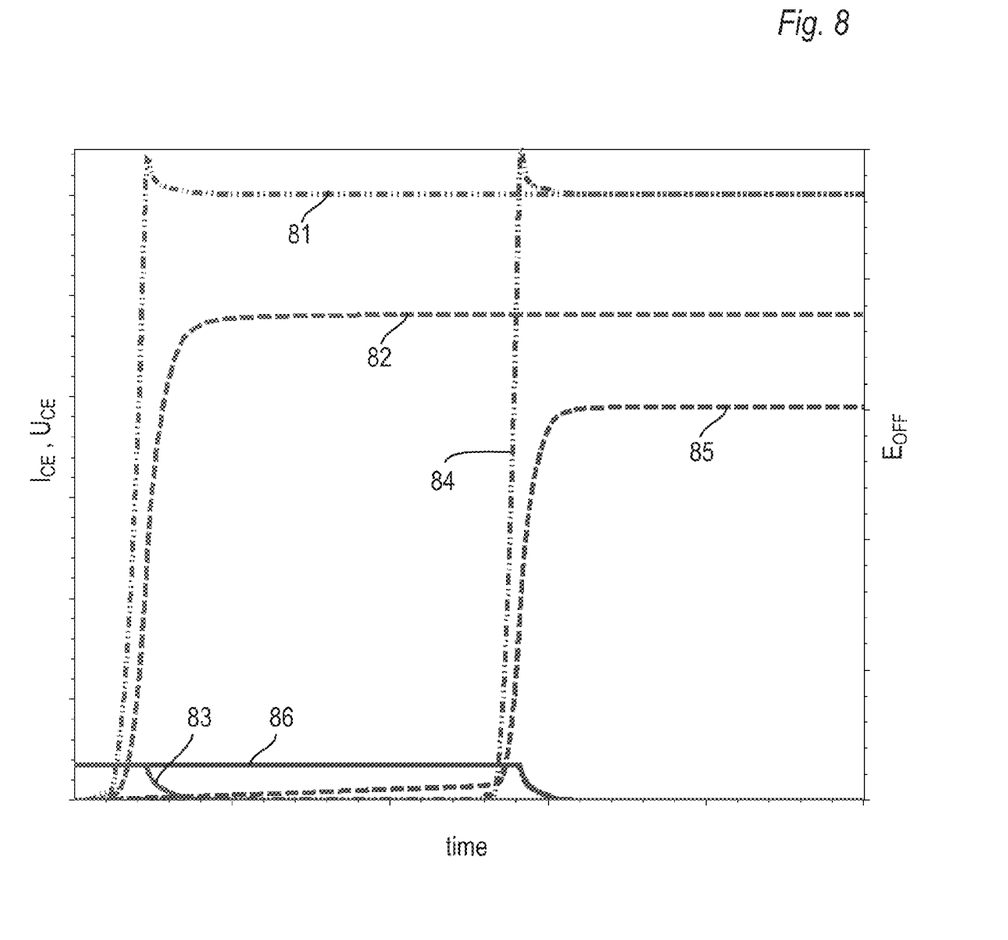
FIG. 8 illustrates a comparison between the switching according to one embodiment and the switching of a reference device.

FIG. 8 illustrates a comparison between the switching behaviour of the semiconductor devices as described herein and a reference structure. The switching of the reference device is indicated by curves 81, 82 and 83 wherein curve 81 denotes the collector-emitter voltage $U_{CE}$, curve 83 denotes the collector-emitter current $I_{CE}$, and curve 82 denotes the cumulative power dissipation $$E_{OFF} = \int I_{CE} * U_{CE} dt$$

during switching. Similarly, curve 84 denotes the collector-emitter voltage $U_{CE}$, curve 86 denotes the collector-emitter current $I_{CE}$, and curve 85 denotes the cumulative power dissipation $E_{OFF}$ during switching for a semiconductor device as described herein. Curves 84, 85 and 86 are off-set to curves 81, 82 and 83 since the device is switched off shortly after the off-voltage is applied to the switch electrode 43. It would, however, also be possible to adjust the switching signals so that both devices would be turned off at the same time. As it becomes apparent from a comparison between curves 82 and 85 indicating the cumulative power dissipation for the respective devices, a semiconductor device having a switch electrode 43 exhibits a reduced total switching loss due to the action of the switch electrode 43. For the particular case illustrated in FIG. 8 a reduction of the dissipated power of about 20% was observed.

To describe the device in different terms, a semiconductor device is provided which includes a switch electrode which is at least partially arranged below the gate electrode. The switch electrode is brought, during on-state, to a voltage sufficient for producing a potential barrier for minority charge carriers and is brought, shortly before the device is switched off, to a voltage which is negative with respect to the voltage supplied during on-state. The semiconductor device can be a power semiconductor device such as an IGBT having trench structures which accommodates the gate and the switch electrode. By switching the voltage supplied to the switch electrode shortly before the device is switched off, the switching losses can be reduced while the on-state losses are reduced due to the action of the potential barrier generated by the switch electrode.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a semiconductor substrate comprising an emitter region, a drift region, a body region, and a source region, the drift region formed between the emitter and the body region, and the body region formed between the drift and the source region;
a first trench structure extending from the source region at least partially into the drift region, comprising a gate electrode arranged next to the body region and a switch electrode arranged in portions next to the drift region, wherein the switch and gate electrodes are electrically insulated from each other in the trench structure;
a first gate driver electrically connected to the gate electrode; and
a second gate driver electrically connected to the switch electrode.

2. The semiconductor device of claim 1, further comprising a second trench structure, arranged adjacent to the first trench structure and comprises a second gate electrode arranged next to the body region and a second switch electrode arranged at least in portions next to the drift region, and a mesa structure, arranged between the first and the second trench structures.

3. The semiconductor device of claim 2, wherein the mesa structure comprises a lateral width W between the first and second trench structures of about 1 µm or less.

4. The semiconductor device of claim 3, comprising wherein the lateral width W is about 0.5 µm or less.

5. The semiconductor device of claim 1, wherein, in a cross-section of the semiconductor device, the first trench structure comprises two gate electrodes with the switch electrode being partially arranged therebetween.

6. The semiconductor device of claim 5, comprising wherein a lower end of the switch electrode extends deeper into the drift region than a lower end of the gate electrodes.

7. The semiconductor device of claim 1, wherein the drift region comprises a vertical extension LDrift between the body and the emitter region, wherein a lower end of the switch electrode extends into the drift region to a length L of not more than 0.2*LDrift.

8. The semiconductor device of claim 7, comprising wherein the lower end of the switch electrode extends into the drift region to the length L of not more than 0.1*LDrift.

9. The semiconductor device of claim 1, wherein the semiconductor device comprises a common gate driver and at least one retardation element, wherein the first gate driver is formed by the common gate driver and the retardation element and the second gate driver is formed by the common gate driver.

10. The semiconductor device of claim 1, wherein the drift region comprises a reduced doping concentration in proximity to the switch electrode.

11. A semiconductor device, comprising:
a semiconductor substrate comprising an emitter region of a second conductivity type, a drift region of a first conductivity type, a body region of the second conductivity type and a source region of the first conductivity type, the drift region being formed between the emitter and the body region, and the body region being formed between the drift and the source region;
at least a first trench structure extending from the source region at least partially into the drift region, the first trench structure comprising at least a gate electrode arranged next to the body region and at least a switch electrode arranged at least in portions next to the drift region, wherein the switch and gate electrodes are electrically insulated from each other in the trench structure;
a common gate driver, the common gate driver being electrically connected to the switch electrode; and
at least one retardation element, wherein the gate electrode is electrically connected to the common gate driver via the retardation element.

12. The semiconductor device of claim 11, further comprising a second trench structure, which is arranged adjacent to the first trench structure and comprises a gate electrode arranged next to the body region and a switch electrode arranged at least in portions next to the drift region, and a mesa structure, which is arranged between the first and the second trench structures.

13. The semiconductor device of claim 12, wherein the mesa structure comprises a lateral width W between the first and second trench of about 1 µm or less.

14. The semiconductor device of claim 11, wherein the drift region comprises a vertical extension LDrift between the body and the emitter region, wherein a lower end of the switch electrode extends into the drift region to a length L of not more than 0.2*LDrift.

15. A power semiconductor unit, comprising:
semiconductor device, comprising:
a semiconductor substrate comprising an emitter region of a second conductivity type, a drift region of a first conductivity type, a body region of the second conductivity type and a source region of the first conductivity type, the drift region being formed between the emitter and the body region, and the body region being formed between the drift and the source region; and
at least two trench structures extending from the source region at least partially into the drift region, the trench structures being arranged laterally spaced from each other and forming a mesa structure therebetween, wherein each of the trench structures comprises at least a gate electrode arranged next to the body region and at least a switch electrode arranged at least in portions next to the drift region, wherein the switch and gate electrodes are electrically insulated from each other in the trench structure;
wherein the drift region comprises a vertical extension LDrift between the body and the emitter region, wherein a lower end of the switch electrode extends into the drift region to a length L of not more than 0.2*LDrift.

16. The power semiconductor unit of claim 15, further comprising
a first gate driver electrically connected to the gate electrode; and
a second gate driver electrically connected to the switch electrode.

17. A semiconductor device, comprising:
a semiconductor substrate comprising an emitter region of a second conductivity type, a drift region of a first conductivity type, a body region of the second conductivity type and a source region of the first conductivity type, the drift region being formed between the emitter and the body region, and the body region being formed between the drift and the source region;
at least a first trench structure extending from the source region at least partially into the drift region, the first trench structure comprising at least a gate electrode arranged next to the body region and at least a switch electrode arranged at least in portions next to the drift region, wherein the switch and gate electrodes are electrically insulated from each other in the trench structure;
a first pad structure electrically connected to the gate electrode; and a second pad structure electrically connected to the switch electrode and insulated from the first pad structure.

18. The semiconductor device of claim 17, further comprising a second trench structure, which is arranged adjacent to the first trench structure and comprises a gate electrode arranged next to the body region and a switch electrode arranged at least in portions next to the drift region, and a mesa structure, which is arranged between the first and the second trench structures.

19. The semiconductor device of claim 18, wherein the mesa structure comprises a lateral width W between the first and second trench structures of about 1 μm or less.

20. The semiconductor device of claim 17, wherein the drift region comprises a vertical extension LDrift between the body and the emitter region, wherein a lower end of the switch electrode extends into the drift region to a length L of not more than 0.2*LDrift.

21. A method for switching a semiconductor device, comprising:
   providing a semiconductor device comprising an emitter region of a second conductivity type, a drift region of a first conductivity type, a body region of the second conductivity type and a source region of the first conductivity type, the drift region being formed between the emitter and the body region, and the body region being formed between the drift and the source region, wherein the semiconductor device further comprises at least a first trench structure extending from the source region at least partially into the drift region, the first trench structure comprising at least a gate electrode arranged next to the body region and at least a switch electrode arranged at least in portions next to the drift region, wherein the switch and gate electrodes are electrically insulated from each other in the trench structure;
   bringing the semiconductor device into an on-state by applying a first on-voltage of a second polarity to the gate electrode to generate a conductive channel in the body region and by applying a second on-voltage of the second polarity to the switch electrode; and
   bringing the semiconductor device into an off-state by applying a first off-voltage to the switch electrode before applying a second off-voltage to the gate electrode, wherein the first and second off-voltages are selected from zero voltage or voltages of first polarity.

22. The method of claim 21, comprising supplying, when turning on the semiconductor device, the gate and switch electrode with the same on-voltage.

23. The method of claim 21, comprising subsequently supplying, when turning off the semiconductor device, the switch and gate electrodes with the same off-voltage.

24. The method of claim 21, comprising applying the first off-voltage to the switch electrode about 0.2 μs to about 20 μs before applying the second off-voltage to the gate electrode.

25. The method of claim 21, comprising applying the first off-voltage to the switch electrode about 0.4 μs to about 10 μs before applying the second off-voltage to the gate electrode.

* * * * *